(12) United States Patent
Liu et al.

(10) Patent No.: US 12,068,736 B2
(45) Date of Patent: *Aug. 20, 2024

(54) MULTIPLEXER WITH FLOATING RAISED FRAME BULK ACOUSTIC WAVE DEVICE

(71) Applicant: Skyworks Global Pte. Ltd., Singapore (SG)

(72) Inventors: Jiansong Liu, Fremont, CA (US); Yuhao Liu, Irvine, CA (US); Kwang Jae Shin, Yongin (KR); Chun Sing Lam, San Jose, CA (US)

(73) Assignee: Skyworks Global Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/139,745

(22) Filed: Apr. 26, 2023

(65) Prior Publication Data
US 2023/0378929 A1 Nov. 23, 2023

Related U.S. Application Data

(63) Continuation of application No. 17/130,386, filed on Dec. 22, 2020, now Pat. No. 11,677,374, which is a continuation of application No. 16/898,840, filed on Jun. 11, 2020, now Pat. No. 11,316,494.

(60) Provisional application No. 62/861,871, filed on Jun. 14, 2019, provisional application No. 62/861,873, filed on Jun. 14, 2019.

(51) Int. Cl.
H03H 9/02 (2006.01)
H03H 9/05 (2006.01)
H03H 9/13 (2006.01)
H03H 9/54 (2006.01)

(52) U.S. Cl.
CPC ....... *H03H 9/02118* (2013.01); *H03H 9/0211* (2013.01); *H03H 9/0504* (2013.01); *H03H 9/13* (2013.01); *H03H 9/54* (2013.01)

(58) Field of Classification Search
CPC ...... H03H 9/0211; H03H 9/0504; H03H 9/13; H03H 9/54; H03H 9/173; H03H 9/174; H03H 9/175; H03H 9/02118
USPC ........................................ 333/133, 187, 188
See application file for complete search history.

(56) References Cited

U.S. PATENT DOCUMENTS

| 7,280,007 B2 | 10/2007 | Feng et al. | |
| 8,441,328 B2 | 5/2013 | Shin | |
| 8,476,995 B2 | 7/2013 | Shin | |
| 8,791,776 B2 * | 7/2014 | Pang | H03H 9/02118 333/187 |

(Continued)

Primary Examiner — Rakesh B Patel
Assistant Examiner — Jorge L Salazar, Jr.
(74) Attorney, Agent, or Firm — Knobbe, Martens, Olson & Bear, LLP

(57) ABSTRACT

Aspects of this disclosure relate to a bulk acoustic wave device with a floating raised frame structure. The bulk acoustic wave device includes a first electrode, a second electrode, a piezoelectric layer positioned between the first electrode and the second electrode, and a floating raised frame structure positioned on a same side of the piezoelectric layer as the first electrode and spaced apart from the first electrode. The floating raised frame structure is at a floating potential. The bulk acoustic wave device can suppress a raised frame mode. Related methods, filters, multiplexers, radio frequency front ends, radio frequency modules, and wireless communication devices are disclosed.

20 Claims, 15 Drawing Sheets

(56) References Cited

U.S. PATENT DOCUMENTS

| | | |
|---|---|---|
| 9,166,557 B2 | 10/2015 | Hashimoto et al. |
| 9,385,684 B2 | 7/2016 | Nikkel et al. |
| 9,520,855 B2 | 12/2016 | Feng et al. |
| 10,205,432 B2 | 2/2019 | Yokoyama et al. |
| 10,432,166 B2 | 10/2019 | Liu et al. |
| 10,469,049 B2 | 11/2019 | Liu et al. |
| 10,680,576 B2 | 6/2020 | Yokoyama et al. |
| 10,790,799 B2 | 9/2020 | Liu et al. |
| 11,316,494 B2 | 4/2022 | Liu et al. |
| 11,677,374 B2 | 6/2023 | Liu et al. |
| 2009/0134957 A1 | 5/2009 | Shin |
| 2014/0125203 A1 | 5/2014 | Choy et al. |
| 2018/0175275 A1 | 6/2018 | Nishihara et al. |
| 2018/0219528 A1 | 8/2018 | Liu et al. |
| 2020/0099359 A1 | 3/2020 | Liu et al. |
| 2020/0274520 A1 | 8/2020 | Shin et al. |
| 2020/0395911 A1 | 12/2020 | Liu et al. |
| 2021/0111692 A1 | 4/2021 | Liu et al. |

* cited by examiner

MULTIPLEXER WITH FLOATING RAISED FRAME BULK ACOUSTIC WAVE DEVICE

CROSS-REFERENCE TO RELATED APPLICATION

Any and all applications for which a foreign or domestic priority claim is identified in the Application Data Sheet, or any correction thereto, are hereby incorporated by reference under 37 CFR 1.57.

BACKGROUND

Technical Field

Embodiments of this disclosure relate to acoustic wave devices and, more specifically, to bulk acoustic wave devices.

Description of Related Technology

Acoustic wave filters can be implemented in radio frequency electronic systems. For instance, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and solidly mounted resonators (SMRs). In BAW resonators, acoustic waves propagate in a bulk of a piezoelectric layer.

BAW devices with a high quality factor (Q) and low Gamma loss are generally desirable. However, quality factor and Gamma loss desired for certain BAW devices can be difficult to achieve.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a bulk acoustic wave device with raised frame mode suppression. The bulk acoustic wave device includes a first electrode, a second electrode, a piezoelectric layer positioned between the first electrode and the second electrode, and a floating raised frame structure. The first electrode is on a first side of the piezoelectric layer. The second electrode is on a second side of the piezoelectric layer. The floating raised frame structure is positioned on the first side of the piezoelectric layer and spaced apart from the first electrode. The floating raised frame structure is at a floating potential. The bulk acoustic wave device is configured to generate a bulk acoustic wave.

The floating raised frame structure can be positioned between the first electrode and the piezoelectric layer.

The floating raised frame structure can be spaced apart from the first electrode by an air gap.

The floating raised frame structure can spaced apart from the first electrode by an electrically insulating material. The electrically insulating material can be silicon dioxide. The bulk acoustic wave device can include additional electrically insulating material positioned between the floating raised frame structure and the piezoelectric layer.

An overlap region of the bulk acoustic wave device can include thicker metal of the first electrode that a central part of an active region, and the first electrode can extends away from the piezoelectric layer in the overlap region. The floating raised frame structure can be spaced apart from the first electrode by an air gap, in which the air gap extends into at least part of the overlap region. The floating raised frame structure can be spaced apart from the first electrode by an electrically insulating material, in which the electrically insulating material extends into at least part of the overlap region.

The floating raised frame structure can be in physical contact with the piezoelectric layer.

The floating the raised frame structure can be disposed along a perimeter of the bulk acoustic wave device. The floating the raised frame structure can be disposed along a periphery of the first electrode. The floating raised frame structure can have an annular shape in plan view.

The bulk acoustic wave device can further include a support substrate and an acoustic reflector disposed between at least a portion of the support substrate and the piezoelectric layer. The piezoelectric layer can be positioned between the first electrode and the acoustic reflector. The first electrode can be positioned between the piezoelectric layer and the acoustic reflector. The acoustic reflector can be an air cavity. The acoustic reflector can be an acoustic Bragg reflector.

Another aspect of this disclosure is a bulk acoustic wave device with raised frame mode suppression. The bulk acoustic wave device includes a first electrode, a second electrode, an acoustic reflector, a piezoelectric layer positioned between the first electrode and the second electrode, and a floating raised frame structure. An active region of the bulk acoustic wave device corresponds to a region in which both the first electrode and the second electrode contact the piezoelectric layer and overlap the acoustic reflector. The floating raised frame structure is outside of the active region of the bulk acoustic wave device. The floating raised frame structure raised frame structure is at a floating potential. The bulk acoustic wave device is configured to generate a bulk acoustic wave.

The floating raised frame structure can be spaced apart from the active region.

The acoustic reflector can be an air cavity. The acoustic reflector can be an acoustic Bragg reflector.

An overlap region of the bulk acoustic wave device can include thicker metal of the first electrode that a central part of the active region, in which the first electrode extends away from the piezoelectric layer in the overlap region. The floating raised frame structure can be spaced apart from the first electrode by an air gap, and the air gap can extend into at least part of the overlap region. The floating raised frame structure can be spaced apart from the first electrode by an electrically insulating material, and the electrically insulating material can extend into at least part of the overlap region.

The floating raised frame structure can be positioned between the first electrode and the piezoelectric layer.

The floating raised frame structure can be spaced apart from the first electrode by an air gap.

The floating raised frame structure can be spaced apart from the first electrode by an electrically insulating material. The electrically insulating material can be silicon dioxide. The bulk acoustic wave device can further include additional electrically insulating material positioned between the floating raised frame structure and the piezoelectric layer.

The floating raised frame structure can be in physical contact with the piezoelectric layer.

The floating the raised frame structure can be disposed along a perimeter of the bulk acoustic wave device. The floating the raised frame structure can be disposed along a periphery of the first electrode. The floating raised frame structure can have an annular shape in plan view.

The piezoelectric layer can be positioned between the first electrode and the acoustic reflector. The first electrode can be positioned between the piezoelectric layer and the acoustic reflector.

Another aspect of this disclosure is an acoustic wave filter that includes a bulk acoustic wave device and at least one additional acoustic wave device. The bulk acoustic wave device includes a floating raised frame structure. The bulk acoustic wave device and the at least one additional acoustic wave device are together arranged to filter a radio frequency signal.

The bulk acoustic wave device can include any suitable combination of features of the bulk acoustic wave devices disclosed herein.

Another aspect of this disclosure is a multiplexer that includes a first acoustic wave filter coupled to a common node and a second acoustic wave filter coupled to the common node. The first acoustic wave filter includes one or more bulk acoustic wave devices that include a floating raised frame structure.

The one or more bulk acoustic wave devices can include any suitable combination of features of the bulk acoustic wave devices disclosed herein.

A radio frequency front end can include the multiplexer and a radio frequency amplifier coupled to the first acoustic wave filter.

A wireless communication device can include the multiplexer and an antenna operatively coupled to the common node.

Another aspect of this disclosure is a multiplexer that includes a first acoustic wave filter coupled to a common node and a second acoustic wave filter coupled to the common node. The first acoustic wave filter has a first passband. The second acoustic wave filter has a second passband. The second acoustic wave filter includes a bulk acoustic wave resonator. The bulk acoustic wave resonator includes a floating raised frame structure at a floating potential. The floating raised frame structure is configured to cause a reflection coefficient of the second acoustic wave filter to be increased in the first passband.

The multiplexer can be configured to support carrier aggregation of at least a first carrier in the first passband and a second carrier within the second passband.

The multiplexer can be arranged as a duplexer.

The multiplexer can further include a third acoustic wave filter coupled to the common node. The multiplexer can be configured to support carrier aggregation of at least a first carrier in the first passband, a second carrier within the second passband, and a third carrier in a third passband of the third acoustic wave filter.

The multiplexer can further include a third acoustic wave filter coupled to the common node and a fourth acoustic wave filter coupled to the common node.

The second acoustic wave filter can include a second bulk acoustic wave resonator, in which the second bulk acoustic wave resonator includes a second floating raised frame structure.

The bulk acoustic wave resonator can include a first electrode, a second electrode, and a piezoelectric layer positioned between the first electrode and the second electrode, in which the floating raised frame structure is positioned on the same side of the piezoelectric layer as the first electrode and spaced apart from the first electrode. The bulk acoustic wave resonator can include an overlap region that includes thicker metal of the first electrode that a central part of the active region, in which the first electrode extends away from the piezoelectric layer in the overlap region. The floating raised frame structure can be spaced apart from the first electrode by an air gap, and the air gap can extend into at least part of the overlap region. The floating raised frame structure can be spaced apart from the first electrode by an electrically insulating material, and the electrically insulating material can extend into at least part of the overlap region.

The bulk acoustic wave resonator can include an active region corresponding to a region in which two electrodes contact a piezoelectric layer and overlap an acoustic reflector, the floating raised frame structure can be spaced apart from the active region.

The floating the raised frame structure can be disposed along a perimeter of the bulk acoustic wave resonator. The floating the raised frame structure can have an annular shape in plan view.

Another aspect of this disclosure is a packaged radio frequency module that includes a packaging substrate, a multiplexer on the packaging substrate, and a radio frequency component on the packaging substrate. The multiplexer includes a first acoustic wave filter coupled to a common node and a second acoustic wave filter coupled to the common node. The second acoustic wave filter includes a bulk acoustic wave resonator that includes a floating raised frame structure at a floating potential. The floating raised frame structure is configured to cause a reflection coefficient of the second acoustic wave filter to be increased in a passband of the first acoustic wave filter. The radio frequency component is electrically coupled to the second acoustic wave filter. The multiplexer and the radio frequency component are enclosed within a common package.

The radio frequency component can include a radio frequency amplifier. The radio frequency amplifier can be a power amplifier. The radio frequency amplifier can be a low noise amplifier.

The radio frequency component can include a radio frequency switch.

The multiplexer can be configured to support carrier aggregation of at least a first carrier in the passband of the first acoustic wave filter a second carrier within a passband of the second acoustic wave filter.

The multiplexer can be arranged as a duplexer.

The multiplexer can further include a third acoustic wave filter coupled to the common node.

The second acoustic wave filter can include a second bulk acoustic wave resonator, in which the second bulk acoustic wave resonator includes a second floating raised frame structure.

The bulk acoustic wave resonator can include a first electrode, a second electrode, and a piezoelectric layer positioned between the first electrode and the second electrode, in which the floating raised frame structure is positioned on the same side of the piezoelectric layer as the first electrode and spaced apart from the first electrode.

The bulk acoustic wave resonator can include an active region corresponding to a region in which two electrodes contact a piezoelectric layer and overlap an acoustic reflector, the floating raised frame structure can be spaced apart from the active region.

The floating the raised frame structure can be disposed along a perimeter of the bulk acoustic wave resonator. The floating the raised frame structure can have an annular shape in plan view.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
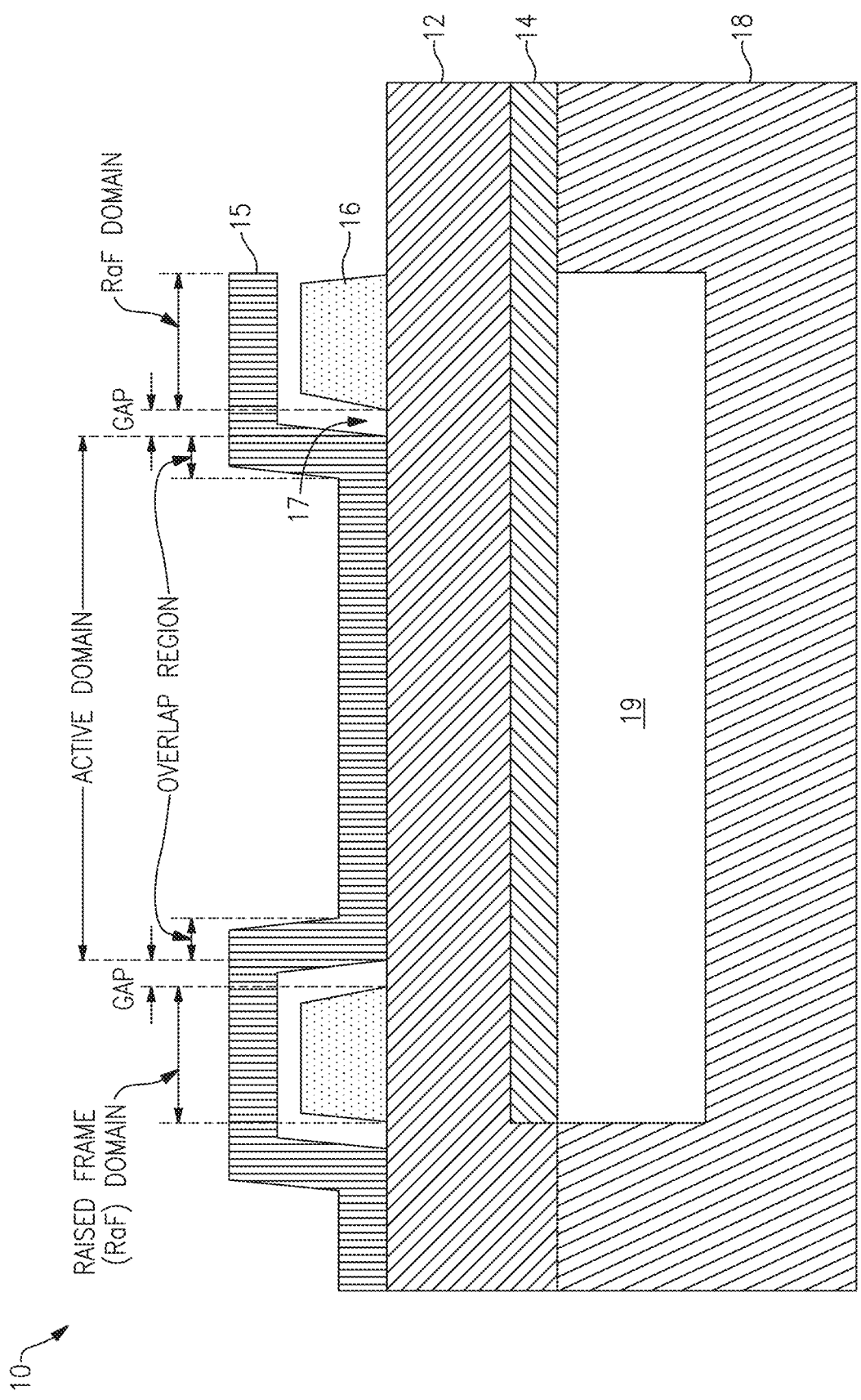
FIG. 1 is a cross sectional view of a bulk acoustic wave device with a floating raised frame structure according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

For developing high performance bulk acoustic wave (BAW) filters, increasing quality factor (Q) and decreasing Gamma (reflection coefficient) loss is generally desirable. Having a high Q can result in a low insertion loss. To achieve a high Q, a raised frame, which can be referred to as a border ring, can be included around a perimeter of a BAW device. The raised frame can block lateral energy leakage from an active domain of a BAW resonator to a passive domain of the BAW resonator.

However, certain raised frames can excite plate waves that can generate relatively strong spurious resonances below the main resonant frequency. In certain instances, BAW devices can be implemented in multiplexers for carrier aggregation applications. The relatively strong plate modes excited by the raised frames can significantly increase a Gamma loss in a carrier aggregation band and result in undesirable multiplexer performance, in which Gamma is a reflection coefficient.

Using a narrower raised frame can decrease the amplitude of spurious responses exited by a raised frame. However, the narrower raised frame can also reduce Q.

Aspects of this disclosure relate to a bulk acoustic wave resonator that includes a floating raised frame structure that can achieve a high Q and low Gamma loss. The bulk acoustic wave resonator can include a gap between a perimeter of the floating raised frame structure and an active region of the bulk acoustic wave resonator. The gap can occupy a gap region around the raised frame domain. The gap region can include air and/or an electrically insulating material. The floating raised frame structure is electrically isolated from an electrode of the bulk acoustic wave resonator that is on the same side of a piezoelectric layer. For example, there can be an air gap and/or an electrically insulating material positioned between the floating raised frame structure and the electrode. The bulk acoustic wave resonator can include an overlap region between at least the center part of an active region and the gap region. In the overlap region, an electrode of the bulk acoustic wave resonator can be thicker than in a center of the active region.

With such floating raised frame structures, a voltage is not applied to the floating raised frame structure and the floating raised frame is at a floating potential. A floating potential can also be referred to as a floating voltage. Being at a floating potential, the floating raised frame structure may not significantly excite plate waves that generate spurious responses. The floating raised frame structure may not degrade an electrometrical coupling coefficient ($k^2$) with no voltage being applied to the floating raised frame structure.

Bulk acoustic wave devices with a floating raised frame structure can reduce and/or eliminate spurious modes excited by a raised frame relative structure compared to a similar bulk acoustic wave device with a raised frame structure at a potential of an electrode of the similar bulk acoustic wave device. The $k^2$ of a bulk acoustic wave device with a floating raised frame structure can be at or approximately at an intrinsic value. A bulk acoustic wave device with a floating raised frame structure can achieve a relatively high Q. A bulk acoustic device with a floating raised frame can contribute to desirable multiplexer performance by, for example, reducing and/or eliminating Gamma loss due to spurious modes excited by a raised frame.

In an embodiment, a bulk acoustic wave device with raised frame mode suppression includes a piezoelectric layer having a first side and a second side opposite to the first side, a first electrode (e.g., an upper electrode or a lower electrode) on the first side of the piezoelectric layer, a second electrode on the second side of the piezoelectric layer, and a floating raised frame structure positioned on the first side of the piezoelectric layer and spaced apart from the first electrode. The floating raised frame structure is at a floating potential. An active region of the bulk acoustic wave device can correspond to a region in which both the first electrode and the second electrode contact the piezoelectric layer and overlap an acoustic reflector (e.g., an air cavity or acoustic Bragg reflector), and the floating raised frame structure can be outside of the active region of the bulk acoustic wave device.

Example bulk acoustic wave devices with floating raised frame structures will now be discussed. Any suitable principles and advantages of these acoustic wave devices with floating raised frame structures can be implemented together with each other. The bulk acoustic wave devices discussed herein can be bulk acoustic wave resonators in an acoustic wave filter. The bulk acoustic wave devices discussed herein can be included in a filter with one or more inductors and one or more capacitors.

FIG. 1 is a cross sectional view of a bulk acoustic wave device 10 according to an embodiment. The bulk acoustic wave device 10 includes a floating raised frame structure 16 that can reduce and/or eliminate spurious raised frame modes. This can contribute to a relatively low Gamma loss of the bulk acoustic wave device 10. As illustrated, the bulk acoustic device 10 includes a piezoelectric layer 12, a lower electrode 14, an upper electrode 15, a floating raised frame structure 16, an air gap 17 between the floating raised frame structure 16 and the upper electrode 15, a support substrate 18, and an air cavity 19.

The piezoelectric layer 12 is positioned between the lower electrode 14 and the upper electrode 15. The piezoelectric layer 12 can be an aluminum nitride (AlN) layer. Alternatively, the piezoelectric layer 12 can be any other suitable piezoelectric layer. An active region or active domain of the bulk acoustic wave device 10 can be defined by the portion of the piezoelectric layer 12 that is in contact with both the lower electrode 14 and the upper electrode 15 and overlaps an acoustic reflector. In the bulk acoustic wave device 10, the air cavity 19 is an acoustic reflector. The active region corresponds to where voltage is applied on opposing sides of the piezoelectric layer 14 over the acoustic reflector. The active domain can be the acoustically active region of the bulk acoustic wave device 10. In the active domain, one or more recessed frame domains (not illustrated in FIG. 1) can be included in some applications.

The lower electrode 14 can have a relatively high acoustic impedance. For example, the lower electrode 14 can include molybdenum (Mo), tungsten (W), ruthenium (Ru), iridium (Ir), platinum (Pt), Ir/Pt, or any suitable combination thereof. Similarly, the upper electrode 15 can have a relatively high acoustic impedance. The upper electrode 15 can be formed of the same material as the lower electrode 14 in certain instances. The upper electrode 15 can include molybdenum (Mo), tungsten (W), ruthenium (Ru), iridium (Ir), platinum (Pt), Ir/Pt, or any suitable combination thereof.

The bulk acoustic wave device 10 includes an overlap region between a gap region and a center part of an active domain. The overlap region includes thicker metal of the upper electrode 15 than the center part of the active domain. As illustrated in FIG. 1, the overlap region extends from the point where the upper electrode 15 extends away from the piezoelectric layer 12 to an edge of the gap region. In the overlap region, the upper electrode 15 can be in contact with the piezoelectric layer 12 and also extend to a height above the floating raised frame structure 16 as shown in FIG. 1. The overlap region is included in the active domain in the bulk acoustic wave device 10 illustrated in FIG. 1.

The bulk acoustic wave device 10 includes a gap region between the overlap region and a raised frame domain. In the gap region, the upper electrode 15 is spaced apart from the floating raised frame structure 16. For example, as illustrated in FIG. 1, the upper electrode 15 can be spaced apart from the floating raised frame structure 16 by the air gap 17. The piezoelectric layer 12 is not in contact with the upper electrode 15 in the gap region. The gap region can be along one or more sides of the bulk acoustic wave device 10. The gap region can surround the active domain. The gap region can have an annular shape in plan view.

The floating raised frame structure 16 is positioned in the raised frame domain. The raised frame domain of the bulk acoustic wave device 10 can have similar mass loading to other bulk acoustic wave devices that include a raised frame structure that is in contact with an upper electrode. In the bulk acoustic wave device 10, the floating raised frame structure 16 is electrically insulated from the upper electrode 15. The floating raised frame structure 16 is at a floating potential in the bulk acoustic wave device 10. Being at a floating potential, the floating raised frame structure 16 should not excite significant spurious responses. The floating raised frame structure 16 can contribute to a relatively high Q of the bulk acoustic wave device 10. The floating raised frame structure 16 can also contribute to a relatively high reflection coefficient (Gamma) for the bulk acoustic wave device 10.

In the bulk acoustic wave device 10, the floating raised frame structure 16 is positioned between the upper electrode 15 and the piezoelectric layer 12. As shown in FIG. 1, the floating raised frame structure 16 can be in physical contact with the piezoelectric layer 12. The floating raised frame structure 16 can be disposed along a periphery of the upper electrode 15. The floating raised frame structure 16 can disposed along a perimeter of the bulk acoustic wave device 10. The floating raised frame structure 16 can be annular in plan view. The floating raised frame structure 16 is included in the raised frame domain on opposing sides of the cross sectional view of FIG. 1.

The floating raised frame structure 16 can be formed of a material with a relatively high acoustic impedance and/or that is relatively heavy. For example, the floating raised frame structure 16 can be include one or more of tungsten (W), iridium (Ir), a ruthenium (Ru), platinum (Pt), gold (Au), copper (Cu), molybdenum (Mo), or tantalum oxide ($Ta_2O_3$). In some instances, the floating raised frame structure 16 can be formed of the same material as the upper electrode 15. In certain instances, the floating raised frame layer 16 can be formed of the same material as the piezoelectric layer 12. As one example, the piezoelectric layer 12 and the floating raised frame layer 16 can both be formed of aluminum nitride (AlN) in some applications.

The bulk acoustic wave device 10 is a film bulk acoustic wave resonator (FBAR). The air cavity 19 is included below the lower electrode 14. The air cavity 19 is defined by defined the geometry of the lower electrode 14 and the support substrate 18 in the bulk acoustic wave 10. The air cavity 19 functions as an acoustic reflector in the bulk acoustic wave device 10. The support substrate 18 can be a silicon substrate. The support substrate 18 can be any other suitable support substrate.

In certain applications, a silicon dioxide layer and/or another passivation layer can be included over the upper electrode 15. Alternatively or additionally, a silicon dioxide layer and/or another passivation layer can be included under the lower electrode 14.

Figure 2:
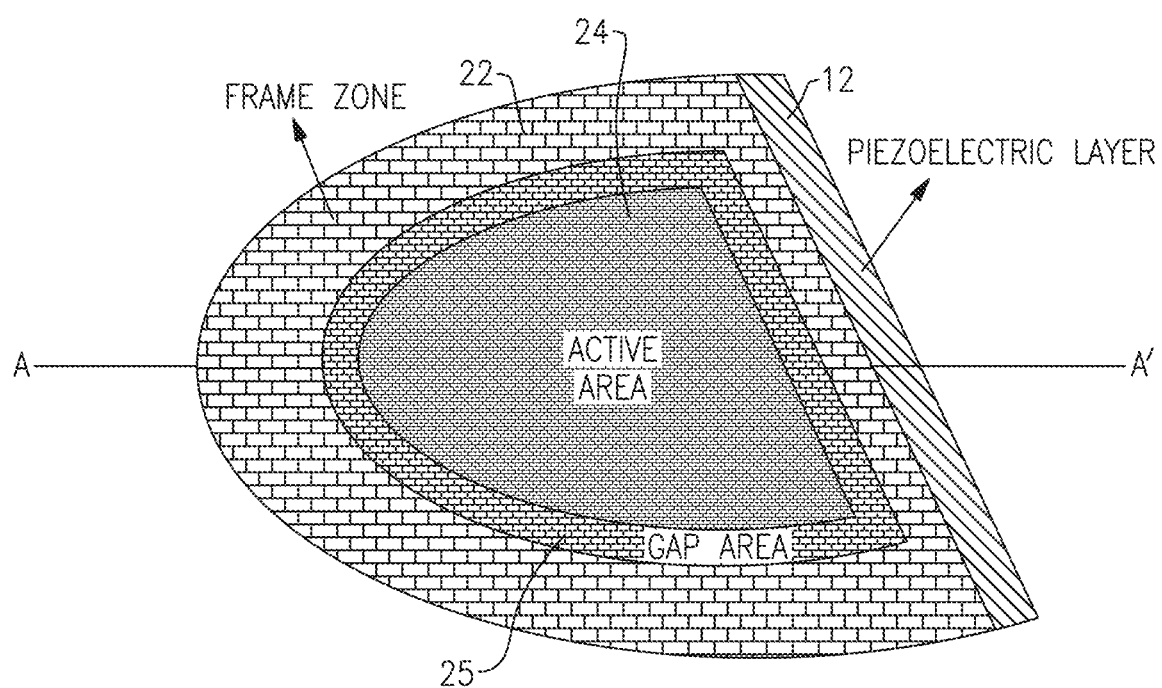
FIG. 2 is a plan view of the bulk acoustic wave device of FIG. 1.

FIG. 2 is a plan view of the bulk acoustic wave device of FIG. 1. The cross sectional view of FIG. 1 is along the line from A to A' in FIG. 2. As shown in FIG. 2, the bulk acoustic wave device includes a raised frame zone 22 around the perimeter of an active region 24 of the bulk acoustic wave device. The raised frame zone 22 is spaced apart from the active region 24 by the gap area 25. The raised frame zone 22 can be referred to as a border ring in certain instances. The floating raised frame structure 16 of FIG. 1 is in the raised frame zone 22 in an embodiment. A floating raised frame structure in accordance with any suitable principles and advantages disclosed herein can be in the raised frame zone 22. Floating raised frame structures disclosed herein can be outside of the active region 24 of the bulk acoustic wave device. The gap region of FIG. 1 is in the gap area 25 in an embodiment. A gap region in accordance with any suitable principles and advantages disclosed herein can be in gap area 25. In the raised frame zone 22 and the gap area 25, the upper electrode 15 can extend further above the piezoelectric layer 12 than in the active area 24.

Additional embodiments of bulk acoustic wave devices will be discussed with reference to example cross sections. These cross sections can correspond to the being along the line from A to A' in FIG. 2. FIGS. 3 to 7 and 9-12 illustrate example cross sections of bulk acoustic wave devices according to certain embodiments. Any suitable combination of features of these bulk acoustic wave devices can be implemented together with each other and/or with any suitable combination of features of the bulk acoustic wave device 10.

Figure 3:
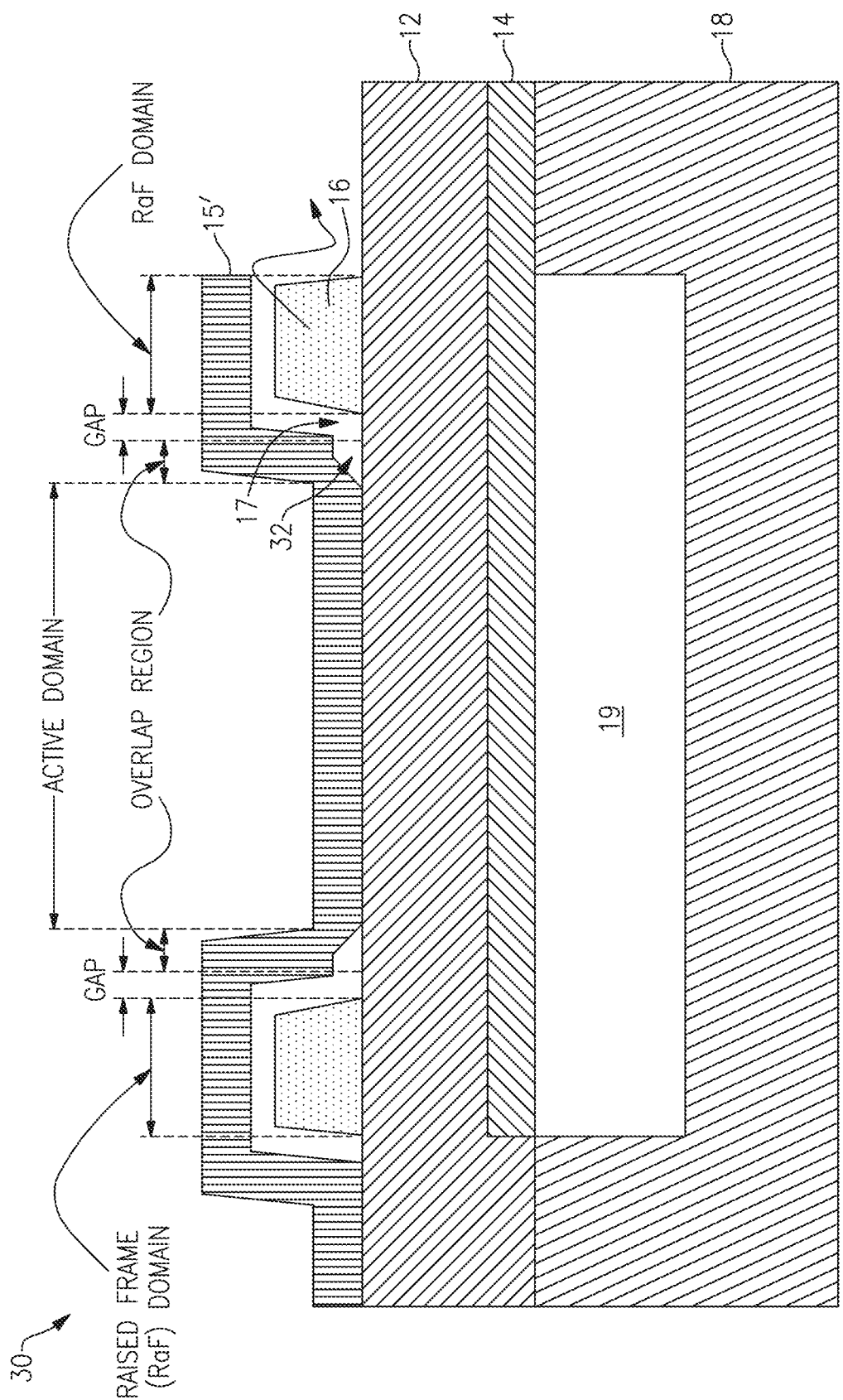
FIG. 3 is a cross sectional view of a bulk acoustic wave device with a floating raised frame structure according to another embodiment.

FIG. 3 is a cross sectional view of a bulk acoustic wave device 30 according to an embodiment. The bulk acoustic device 30 is like the bulk acoustic wave device 10 of FIG. 1, except that bulk acoustic wave device 30 also includes an air gap portion 32 between the upper electrode 15 and the piezoelectric layer 12 in an overlap region. The air gap portion 32 can reduce loading in the overlap region relative to the bulk acoustic wave device 10. The air gap portion 32 can reduce spurious modes of the bulk acoustic wave device 30 related to the overlap region relative to the bulk acoustic wave device 10. The overlap region can be mostly and/or fully outside of the active domain in the bulk acoustic wave device 30.

Figure 4:
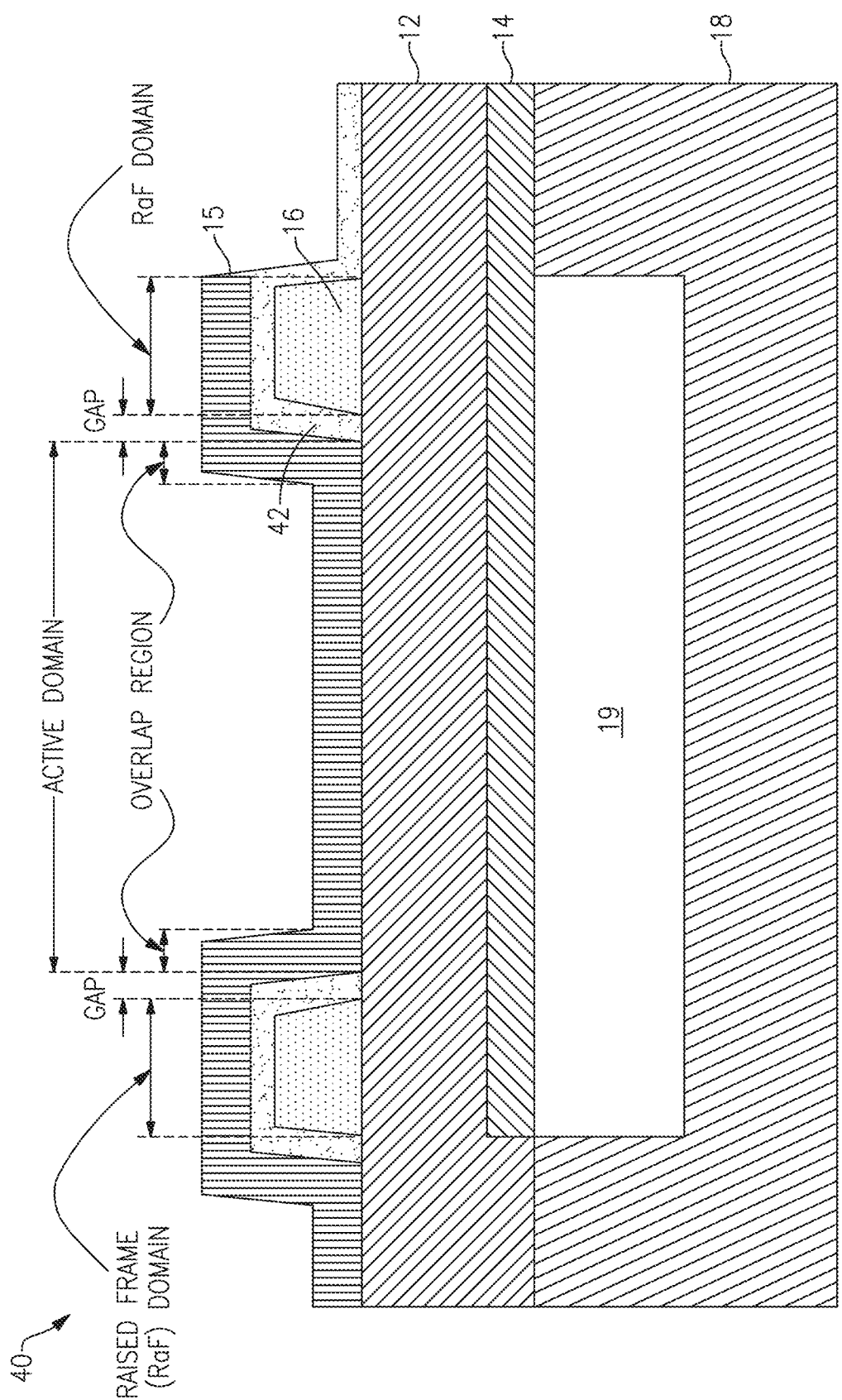
FIG. 4 is a cross sectional view of a bulk acoustic wave device with a floating raised frame structure with an electrically insulating material between the floating raised frame structure and an electrode according to an embodiment.

FIG. 4 is a cross sectional view of a bulk acoustic wave device 40 according to an embodiment. The bulk acoustic device 40 is like the bulk acoustic wave device 10 of FIG. 1, except that bulk acoustic wave device 40 also includes a layer of electrically insulating material 42 between the upper electrode 15 and the piezoelectric layer 12 in place of the air gap 17 of the bulk acoustic wave device 10. The layer of electrically insulating material 42 can be a non-air dielectric material. The layer of electrically insulating material 42 can be an oxide layer. For example, the layer of electrically insulating material 42 can be a silicon dioxide layer. As illustrated, the layer of electrically insulating material 42 is positioned between the upper electrode 15 and the floating raised frame structure 16 in the gap region and the raised frame domain. The layer of electrically insulating material 42 can provide better mechanical integrity than the air gap 17 of the bulk acoustic wave device 10 in certain applications. In some instances, the bulk acoustic wave device 40 can be easier to manufacture than the bulk acoustic wave device 10.

Figure 5:
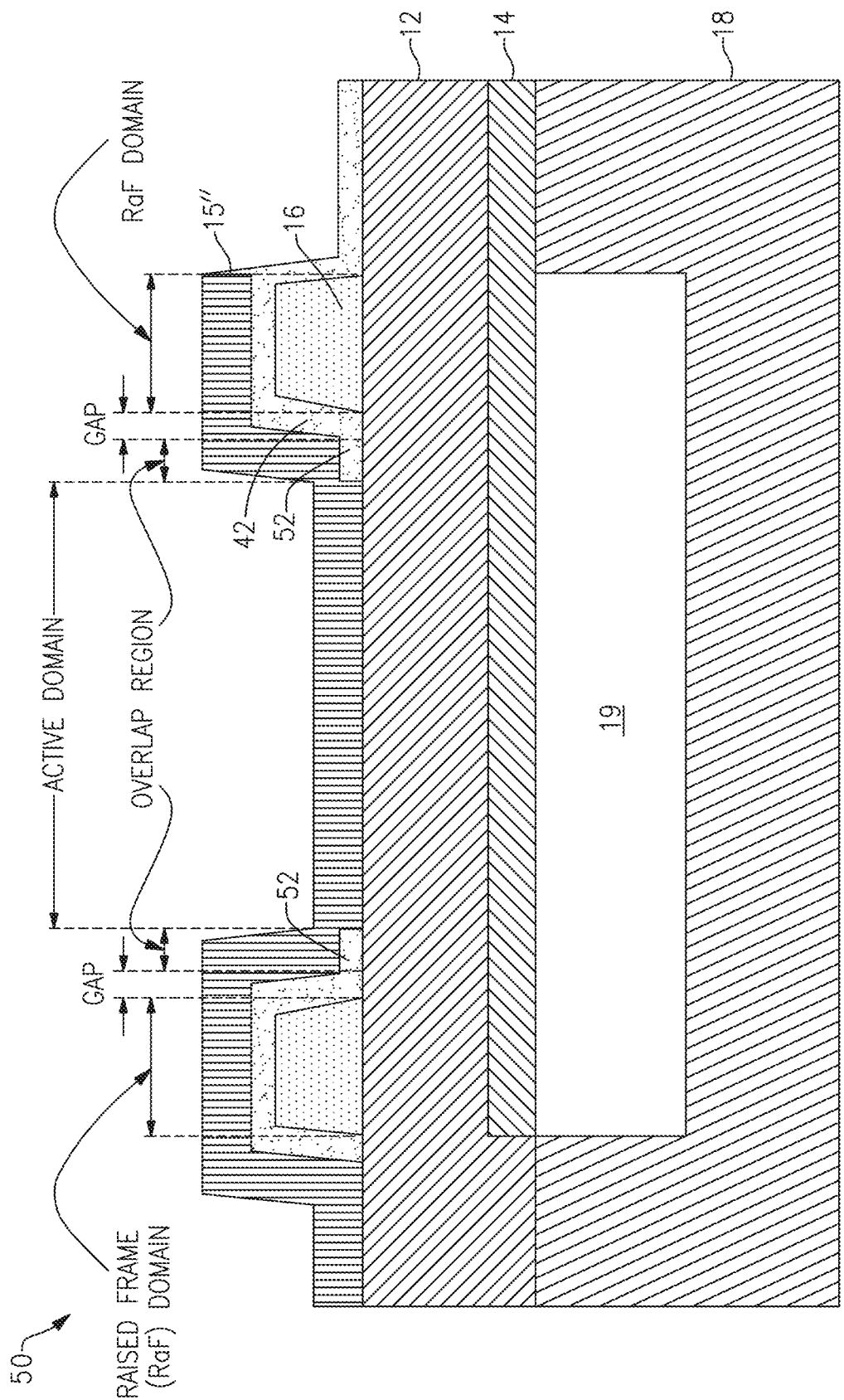
FIG. 5 is a cross sectional view of a bulk acoustic wave device with a floating raised frame structure with an electrically insulating material between the floating raised frame structure and an electrode according to another embodiment.

FIG. 5 is a cross sectional view of a bulk acoustic wave device 50 according to an embodiment. The bulk acoustic device 50 is like the bulk acoustic wave device 40 of FIG. 4, except that bulk acoustic wave device 50 also includes an additional portion of electrically insulating material 52 between the upper electrode 15" and the piezoelectric layer 12 in an overlap region. With the additional portion of electrically insulating material 52, the electrically insulating layer in the bulk acoustic wave device 50 extends into the overlap region. With the additional portion of electrically insulating material 52, the illustrated upper electrode 15" of the bulk acoustic wave device 50 has a different shape than the upper electrode 15 of FIG. 4. The additional portion of electrically insulating material 52 can make aspects of manufacture easier in certain applications. The bulk acoustic wave device 50 is also similar to the bulk acoustic wave device 30 with an electrically insulating layer implemented in place of an air gap.

Figure 6:
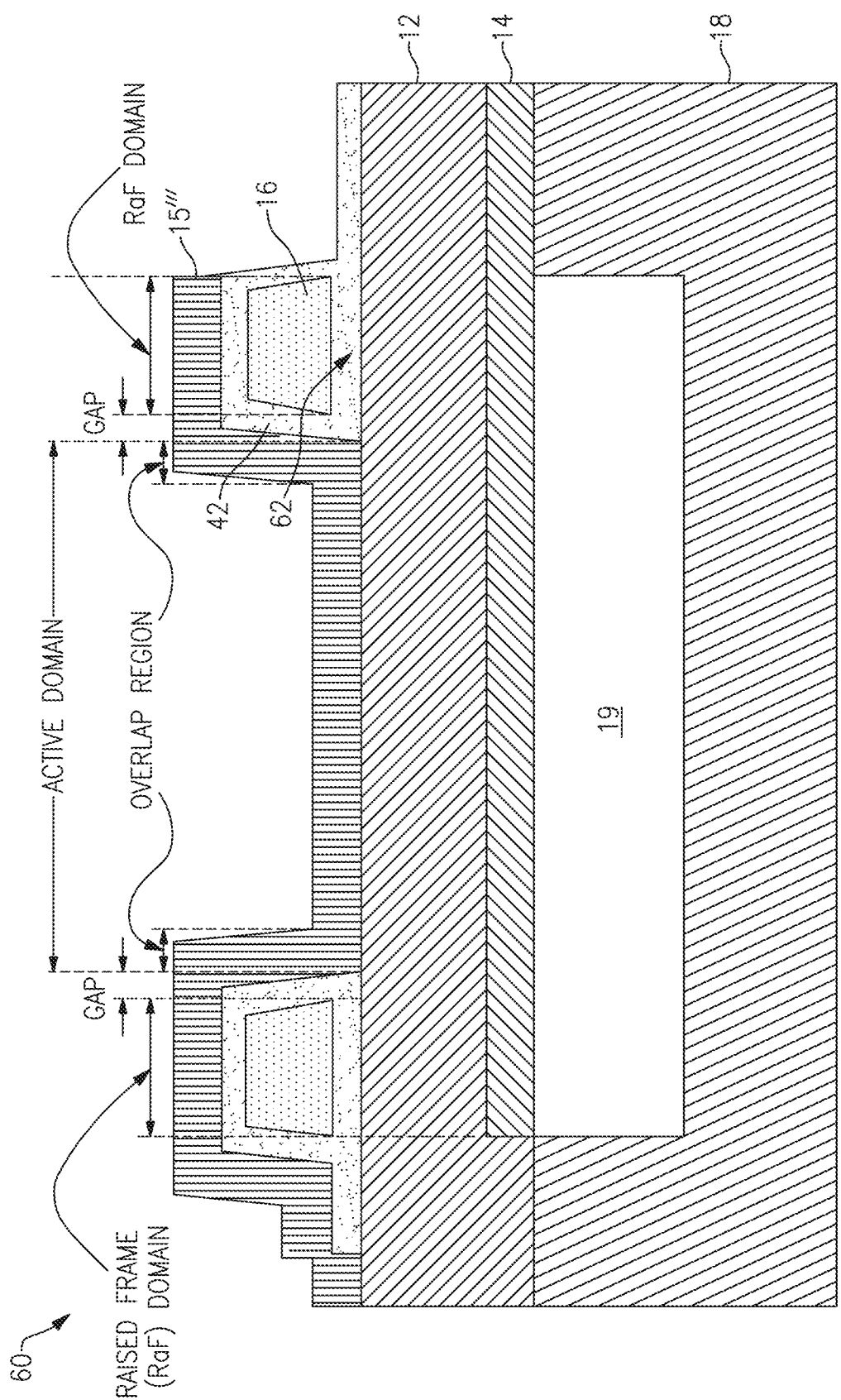
FIG. 6 is a cross sectional view of a bulk acoustic wave device with an electrically insulating material around a floating raised frame structure according to an embodiment.

FIG. 6 is a cross sectional view of a bulk acoustic wave device 60 according to an embodiment. The bulk acoustic device 60 is like the bulk acoustic wave device 40 of FIG. 4, except that bulk acoustic wave device 60 also includes electrically insulating material 62 between the floating raised frame structure 16 and the piezoelectric layer 12. In the bulk acoustic wave device 60, the floating raised frame structure 16 is buried in electrically insulating material. The electrically insulating material can extend beyond opposing sides of the air cavity 19 in a lateral direction, for example, as shown in FIG. 6. The upper electrode 15''' of the bulk acoustic wave device 60 has a different shape than the upper electrode 15 of FIG. 4.

Figure 7:
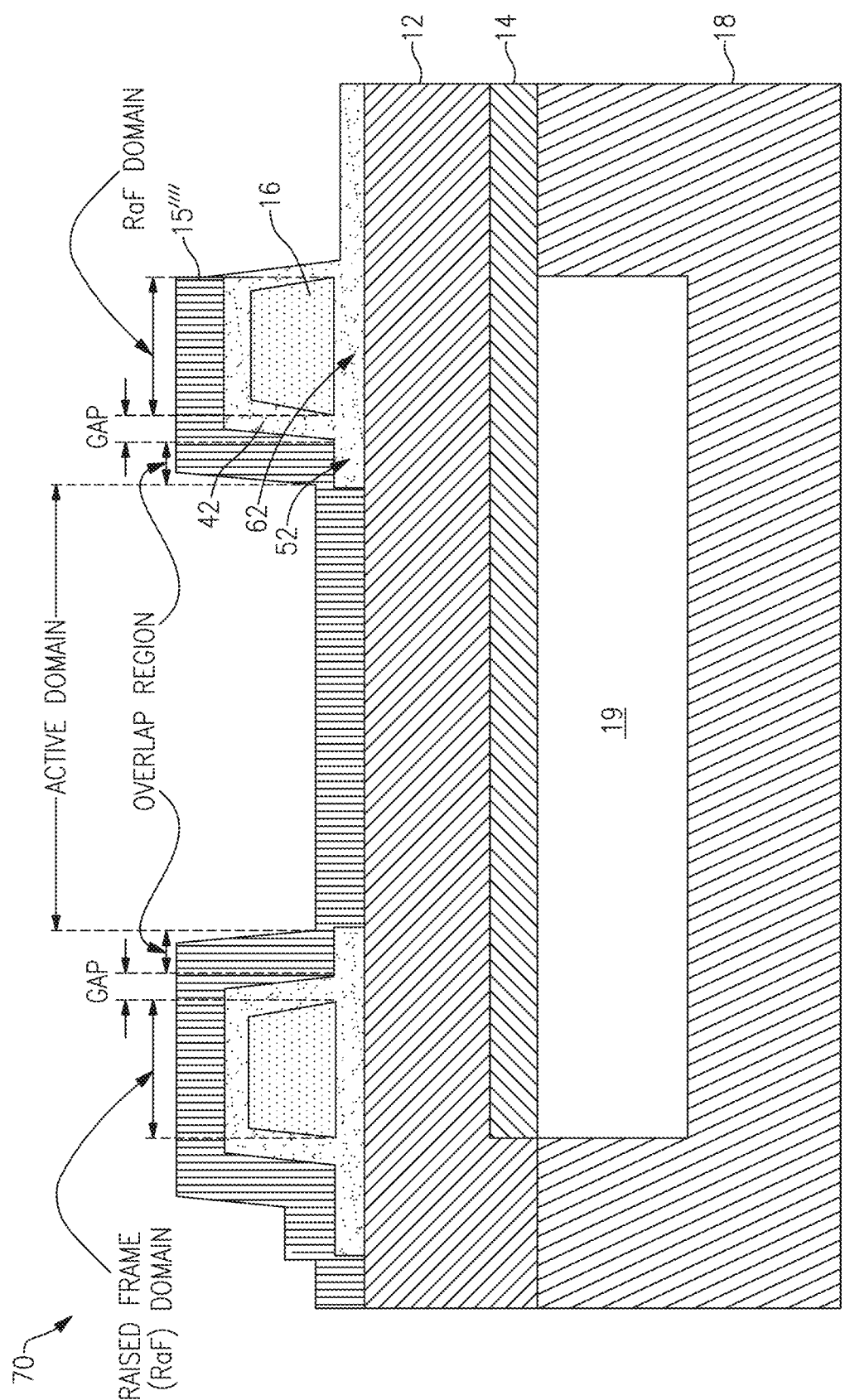
FIG. 7 is a cross sectional view of a bulk acoustic wave device with an electrically insulating material around a floating raised frame structure according to another embodiment.

FIG. 7 is a cross sectional view of a bulk acoustic wave device 70 according to an embodiment. The bulk acoustic device 70 is like the bulk acoustic wave device 60 of FIG. 6, except that bulk acoustic wave device 70 also includes an additional portion of electrically insulating material 52 between the upper electrode 15"" and the piezoelectric layer 12 in an overlap region. The bulk acoustic device 70 is also like the bulk acoustic wave device 50 of FIG. 5, except that bulk acoustic wave device 70 also includes electrically insulating material 62 between the floating raised frame structure 16 and the piezoelectric layer 12. The shape of the illustrated upper electrode 15"" is different than the upper electrode 15" of the bulk acoustic wave device 50 of FIG. 5 and different than the upper electrode 15''' of the bulk acoustic wave device 60 of FIG. 6.

Figure 8:
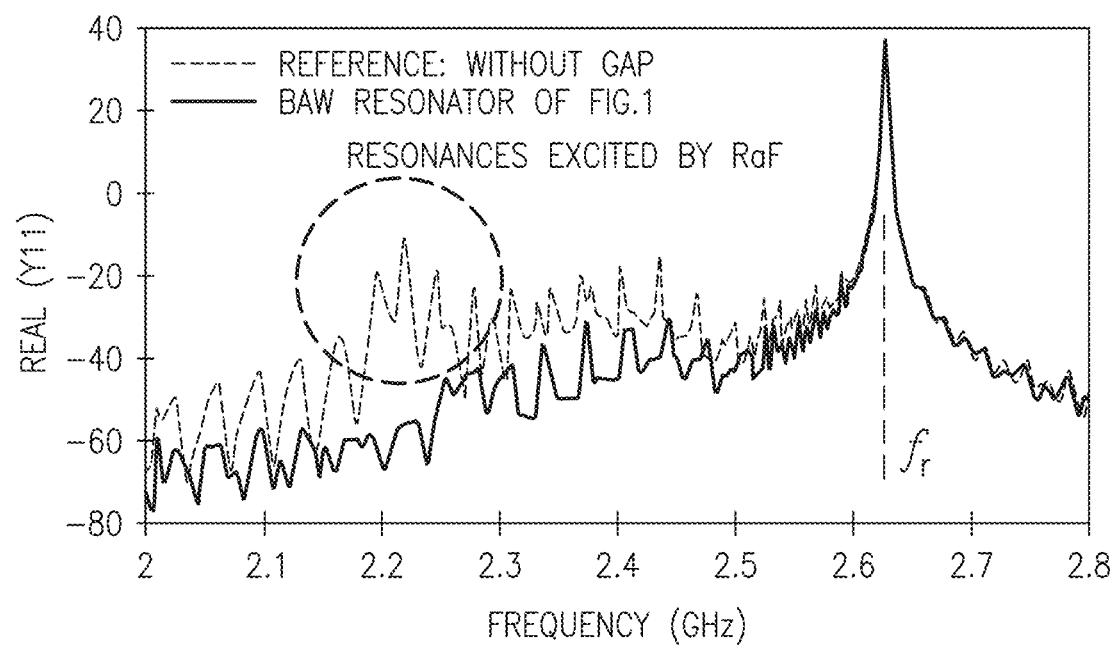
FIG. 8 is a graph comparing simulation results of a bulk acoustic wave device according to an embodiment with a similar bulk acoustic wave device with a raised frame that is in contact with an electrode.

FIG. 8 is a graph comparing simulation results of the bulk acoustic wave device 10 of FIG. 1 with a similar bulk acoustic wave device with a raised frame that is in contact with an electrode. FIG. 8 shows that resonances are excited by the raised frame structure that is in contact with an electrode with the raised frame. In contrast, FIG. 8 indicates that the bulk acoustic wave device 10 does not have significant resonances exited by the floating raised frame structure 16.

Although a floating raised frame structure is positioned between a piezoelectric layer and an upper electrode in certain embodiments disclosed herein, a floating raised frame structure can be located in a different position within a bulk acoustic wave device in some other embodiments. For example, FIGS. 9 and 10 illustrate embodiments of a bulk acoustic wave resonator in which a floating raised frame structure is positioned between a piezoelectric layer and a lower electrode.

Figure 9:
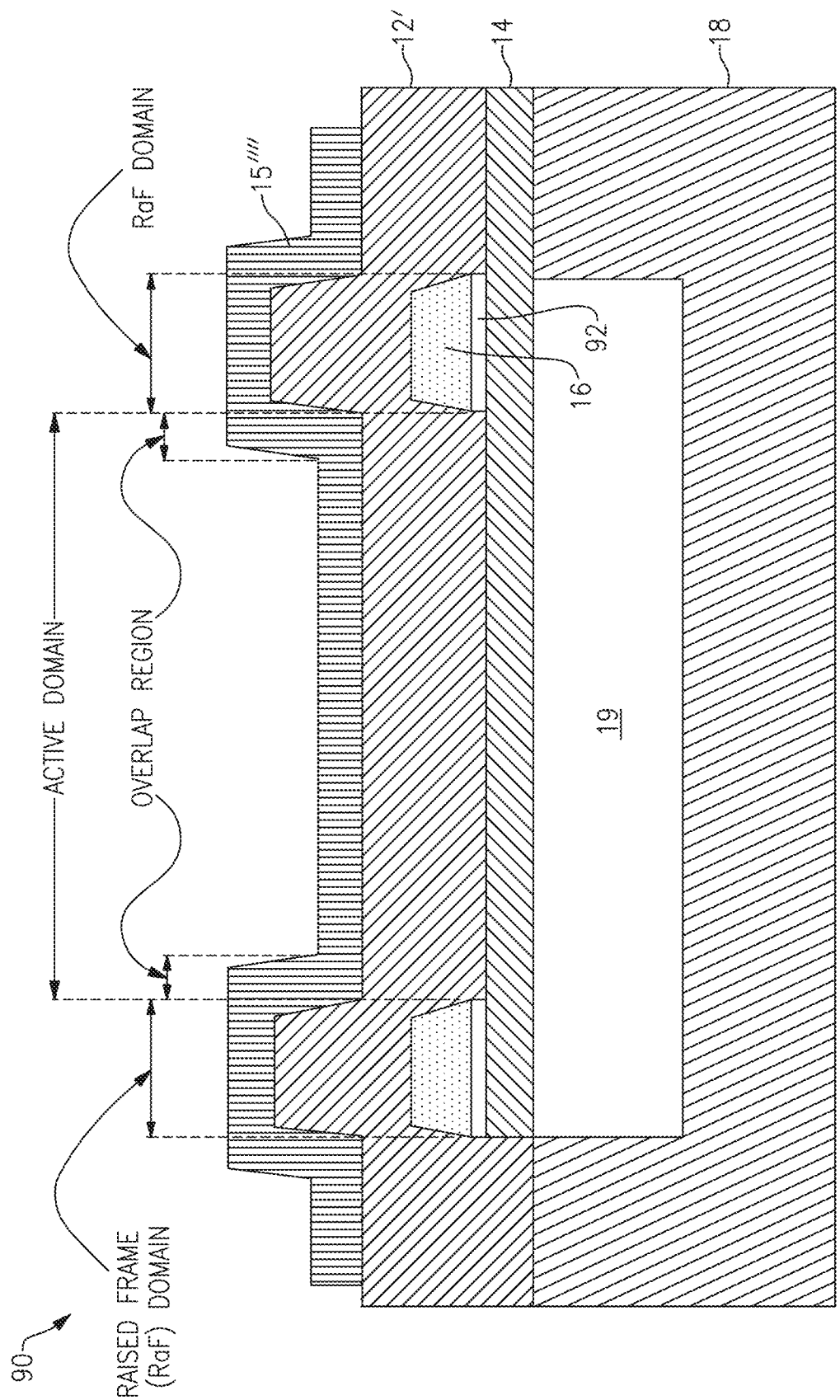
FIG. 9 is a cross sectional view of a bulk acoustic wave device with a floating raised frame structure according to another embodiment.

FIG. 9 is a cross sectional view of a bulk acoustic wave device 90 according to an embodiment. The bulk acoustic device 90 includes a floating raised frame structure 16 that is positioned between a piezoelectric layer 12' and the lower electrode 14. An air gap 92 is located between the floating raised frame structure 16 and the lower electrode 14 in the bulk acoustic wave device 10. This can provide electrical isolation between the lower electrode 14 and the floating raised frame structure 16. In some other embodiments, an electrically insulating dielectric layer can be implemented in place of the air gap 92. Such a dielectric layer can be silicon dioxide, for example. The floating raised frame structure 16 can reduce and/or eliminate spurious raised frame modes. This can contribute to a relatively low Gamma loss of the bulk acoustic wave device 90.

In the bulk acoustic wave device 90, the floating raised frame structure 16 is spaced apart from the lower electrode 14 by an air gap 92. The floating raised frame structure 16 is outside of the active region of the bulk acoustic wave device 90. As shown in FIG. 9, the floating raised frame structure 16 can border the active region in the bulk acoustic wave device 90. With the floating raised frame device 16 positioned between the piezoelectric layer 12' and the lower electrode 14, layers overlying the floating raised frame structure including the piezoelectric layer 12' and the upper electrode 15"" can have different cross-sectional shapes than corresponding layers in bulk acoustic wave devices with a floating raised frame structure 16 positioned between a piezoelectric layer and an upper electrode. The floating raised frame structure 16 of the bulk acoustic wave device 90 can implement any suitable features of the floating raised frame structures disclosed herein.

Figure 10:
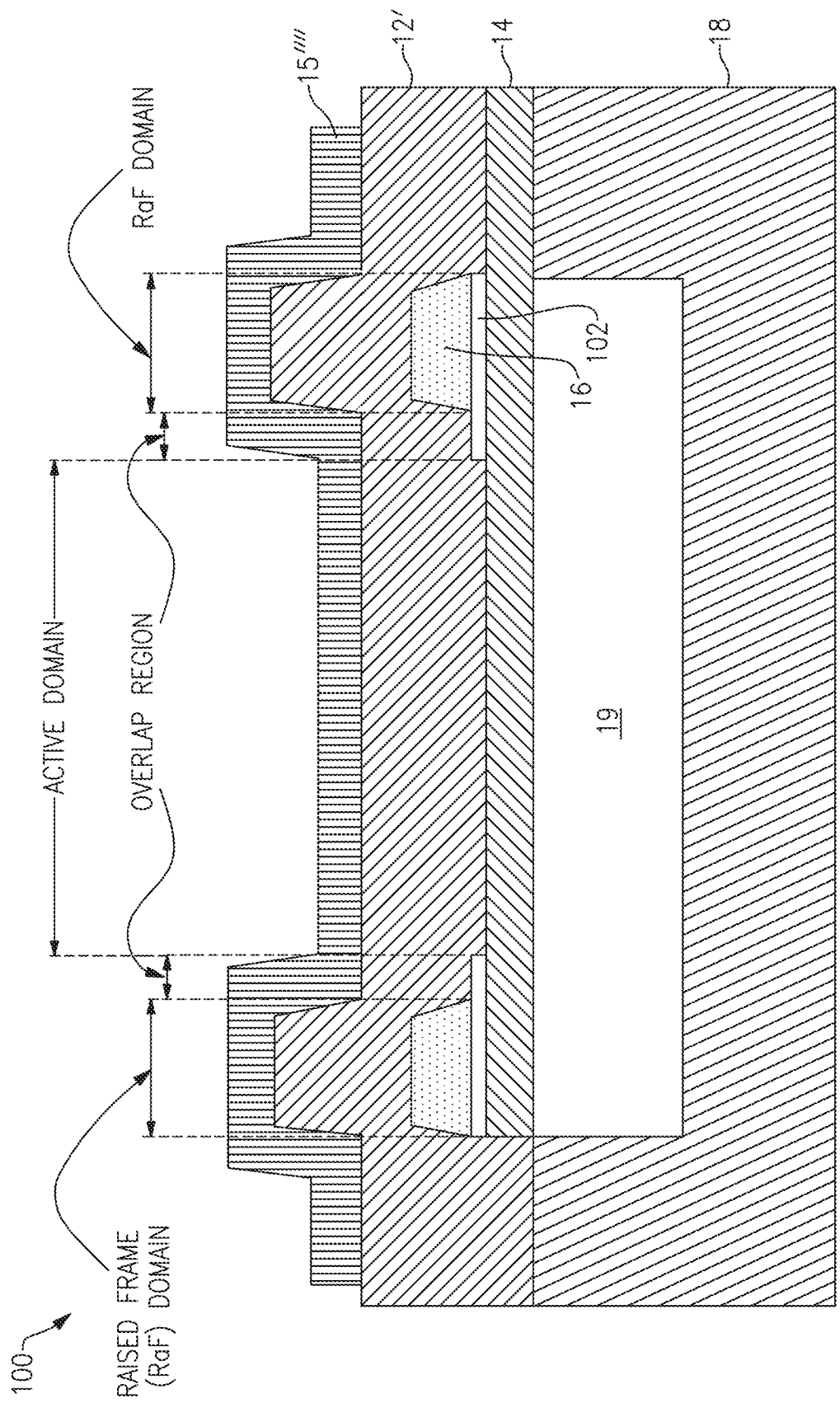
FIG. 10 is a cross sectional view of a bulk acoustic wave device with a floating raised frame structure according to another embodiment.

FIG. 10 is a cross sectional view of a bulk acoustic wave device 100 according to an embodiment. The bulk acoustic device 100 is like the bulk acoustic wave device 90 of FIG. 9, except that an air gap 102 between the lower electrode 14 and the piezoelectric layer 12 extends into the overlap region in the bulk acoustic wave device 100. The floating raised frame structure 16 is spaced apart from the active region in the bulk acoustic wave device 100.

Although FIGS. 9 and 10 illustrate bulk acoustic wave devices with air gaps between a floating raised frame structure and a lower electrode, any suitable electrically insulating material can alternatively or additionally be positioned between a floating raised frame structure and a lower electrode in some other embodiments. In some instances, a floating raised frame structure on the same side of a piezoelectric layer as a lower electrode can be spaced apart from the piezoelectric layer by an electrically insulating material and also spaced apart from the lower electrode.

Figure 11:
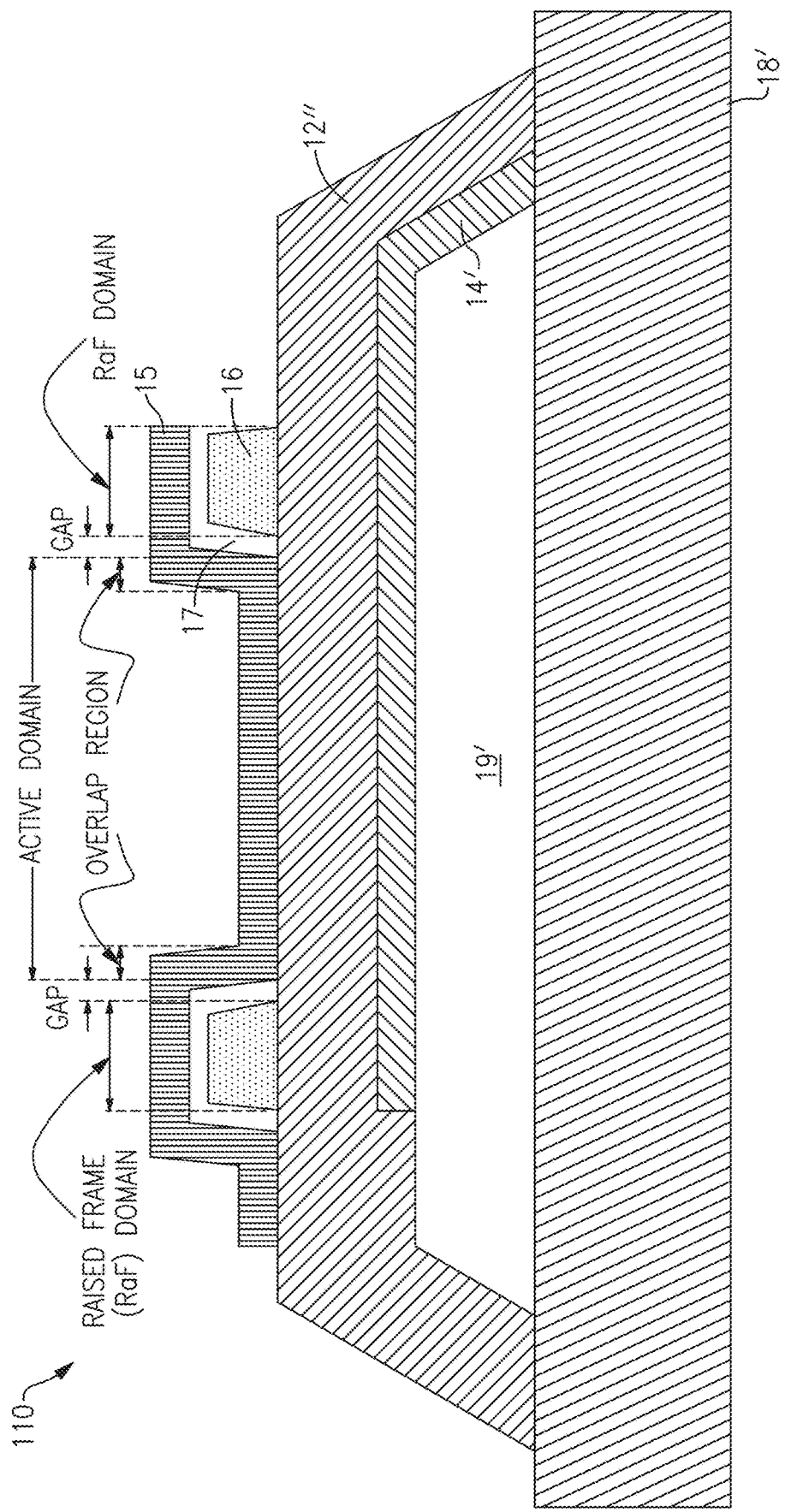
FIG. 11 is a cross sectional view of a bulk acoustic wave device with a floating raised frame structure and an air cavity above a support substrate according to another embodiment.

In certain embodiments, an air cavity of an FBAR can be etched into a support substrate. Any suitable principles and advantages of such embodiments can be applied to an FBAR with an air cavity over a support substrate. FIG. 11 illustrates an embodiment of an FBAR with a floating raised frame structure in which the air cavity is located over a support substrate.

FIG. 11 is a cross sectional view of a bulk acoustic wave device 110 according to an embodiment. The bulk acoustic device 110 is like the bulk acoustic wave device 10 of FIG. 1, except that the air cavity 19' is positioned over the support substrate 18' in the bulk acoustic wave device 110. With the air cavity 19' positioned over the support substrate 18', the air cavity 19', the support substrate 18', the lower electrode 14' and the piezoelectric layer 12' have different geometries in the bulk acoustic wave device 110 compared to corresponding parts of the bulk acoustic wave device 10 of FIG. 1. Sidewalls defining the air cavity 19' are formed of the piezoelectric layer 12" or the piezoelectric layer 12" and the lower electrode 14' in the bulk acoustic wave device 110.

Although certain bulk acoustic wave devices disclosed herein are FBARs, any suitable principles and advantages discussed herein can be applied to a solidly mounted resonator (SMR).

Figure 12:
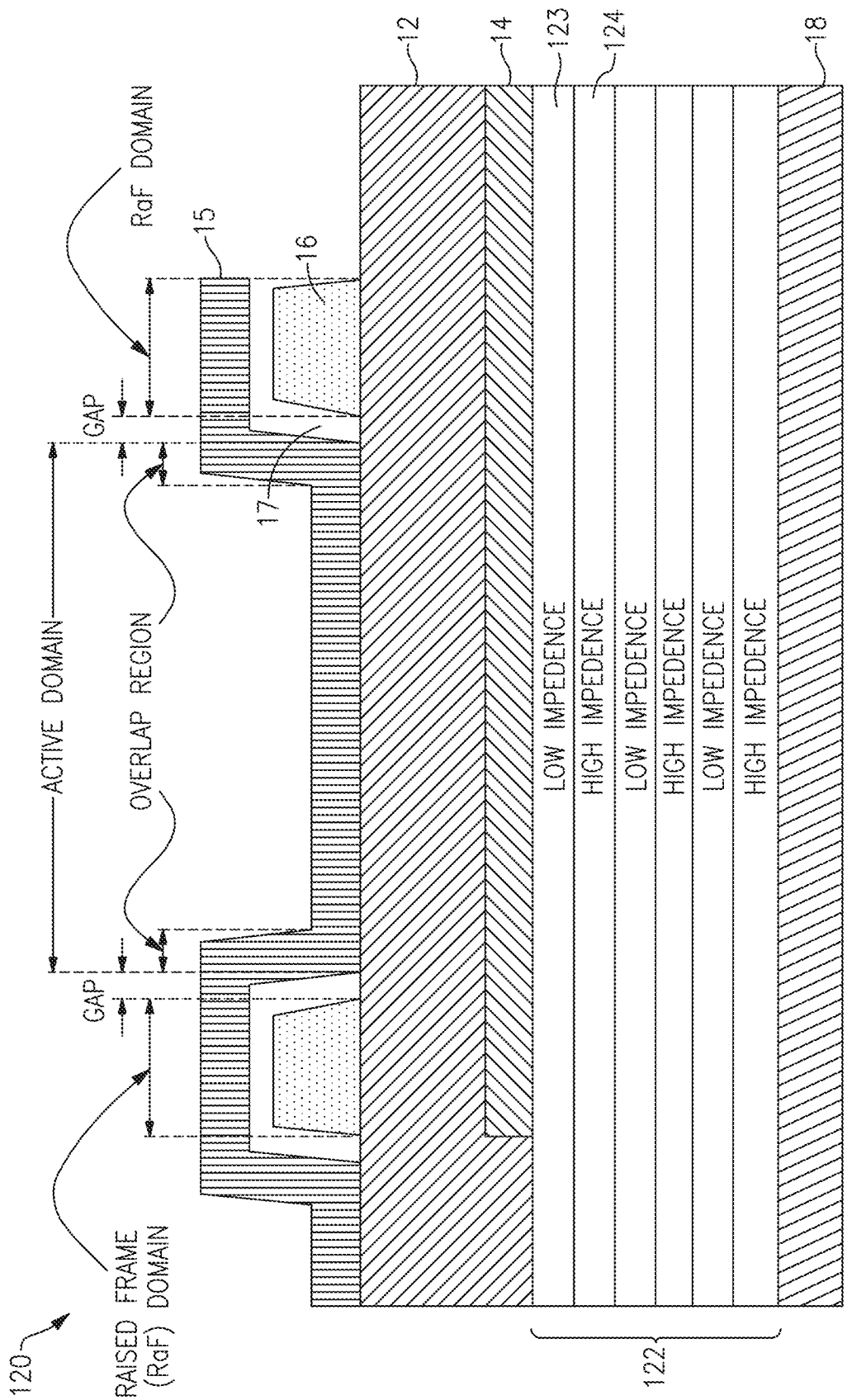
FIG. 12 is a cross sectional view of a solidly mounted bulk acoustic wave device with a floating raised frame structure according to an embodiment.

FIG. 12 is a cross sectional view of a bulk acoustic wave device 120 according to an embodiment. The bulk acoustic device 120 is like the bulk acoustic wave device 10 of FIG. 1, except that the bulk acoustic wave device 120 is an SMR instead of an FBAR. In the bulk acoustic wave device 120, an acoustic Bragg reflector 122 functions as an acoustic reflector. The acoustic Bragg reflector 122 is disposed between the lower electrode 14 and the support substrate 18. The illustrated acoustic Bragg reflector 122 includes alternating low impedance and high impedance layers 123 and 124, respectively. As an example, the acoustic Bragg reflector 122 can include alternating silicon dioxide layers and tungsten layers. As another example, the acoustic Bragg reflector 122 can include alternating silicon dioxide layers and molybdenum layers. Any other suitable features of an SMR can alternatively or additionally be implemented in a bulk acoustic wave device with a floating raised frame structure. The support substrate 18 is typically thicker than the acoustic Bragg reflector 122.

The bulk acoustic wave resonators disclosed herein can be implemented in acoustic wave filters. The acoustic wave filters can be band pass filters arranged to pass a radio frequency band and attenuate frequencies outside of the radio frequency band. Two or more acoustic wave filters can be coupled together at a common node and arranged as a multiplexer, such as a duplexer.

Bulk acoustic wave devices disclosed herein can be included in a filter and/or a multiplexer arranged to filter a radio frequency signal in a fifth generation (5G) New Radio (NR) operating band within Frequency Range 1 (FR1). FR1 can from 410 megahertz (MHz) to 7.125 gigahertz (GHz), for example, as specified in a current 5G NR specification. A filter arranged to filter a radio frequency signal in a 5G NR FR1 operating band can include one or more bulk acoustic wave resonators be implemented in accordance with any suitable principles and advantages disclosed herein. In certain instances, an acoustic wave filter including a bulk acoustic wave device with a floating raised frame can be arranged to have a passband that spans a 5G NR FR1 operating band and also a fourth generation (4G) Long Term Evolution (LTE) operating band. In some instances, an acoustic wave filter including a bulk acoustic wave device with a floating raised frame can be arranged to filter a 4G LTE signal.

5G NR carrier aggregation specifications can present technical challenges. For example, 5G NR carrier aggregations can have wider bandwidth and/or channel spacing than fourth generation (4G) Long Term Evolution (LTE) carrier aggregations. Bulk acoustic wave resonators with a floating raised frame structure disclosed herein can suppress a raised frame mode. This can contribute to achieving a high Gamma outside of a passband of filter that includes such a bulk acoustic wave resonator. In certain applications, the bulk acoustic wave device can be included filter of a multiplexer and the floating raised frame structure can cause Gamma to be increased in a passband of another filter of the multiplexer. This can be advantageous in carrier aggregation applications, for example, by reducing and/or eliminating Gamma degradation from a filter for a first carrier of the carrier aggregation in a band for a second carrier of the carrier aggregation.

Figure 13:
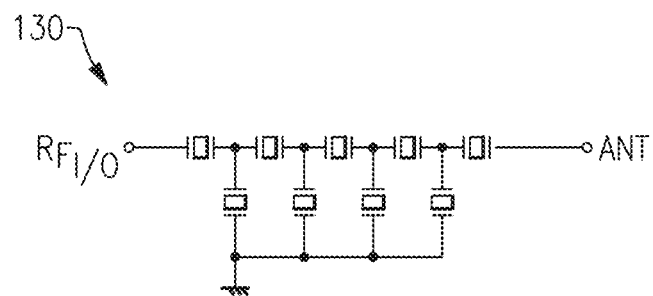
FIG. 13 is a schematic diagram of an example of an acoustic wave ladder filter that includes at least one bulk acoustic wave resonator according to an embodiment.

FIG. 13 is a schematic diagram of an example of an acoustic wave ladder filter 130. The acoustic wave ladder filter 130 can be a transmit filter or a receive filter. The acoustic wave ladder filter 130 can be a band pass filter arranged to filter a radio frequency signal. The acoustic wave filter 130 includes series resonators and shunt resonators coupled between a radio frequency input/output port $RF_{I/O}$ and an antenna port ANT. The radio frequency input/output port $RF_{I/O}$ can be a transmit port in a transmit filter or a receive port in a receive filter. One or more of the illustrated acoustic wave resonators can be a bulk acoustic wave resonator with a floating raised frame structure in accordance with any suitable principles and advantages discussed herein. In some instances, one or more other illustrated acoustic wave resonators can be any other suitable acoustic wave resonators, such as one or more other bulk acoustic wave resonators and/or one or more surface acoustic wave resonators.

A multiplexer can include plurality of acoustic wave filters coupled together at a common node. Multiplexers can support carrier aggregation. For example, a carrier aggregation can aggregate at least a first carrier in a passband of a first acoustic wave filter of a multiplexer and a second carrier in a passband of a second acoustic wave filter of the multiplexer. In this example, it is generally desirable for the first acoustic wave filter to have a high Gamma in the second passband in which Gamma is a reflection coefficient. Bulk acoustic wave devices disclosed herein that include a floating raised frame structure can advantageously achieve a relatively high Gamma.

In an embodiment, a multiplexer includes a first acoustic wave filter coupled to a common node and a second acoustic wave filter coupled to the common node. The first acoustic wave filter has a first passband. The second acoustic wave filter has a second passband. The second acoustic wave filter includes a bulk acoustic wave resonator with a floating raised frame structure at a floating potential. The floating raised frame structure is configured to cause a reflection coefficient of the second acoustic wave filter to be increased in the first passband.

Figure 14:
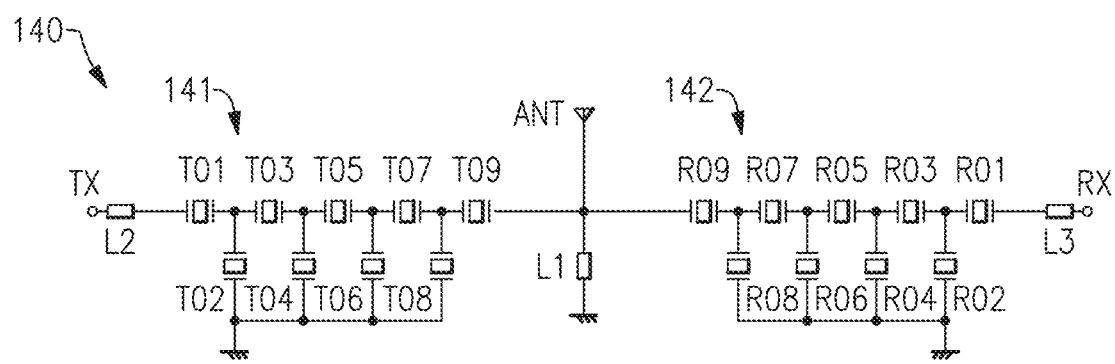
FIG. 14 is a schematic diagram of an example of a duplexer that includes at least one bulk acoustic wave resonator according to an embodiment.

FIG. 14 is a schematic diagram of an example of a duplexer 140. The duplexer 140 includes a transmit filter 141 and a receive filter 142 coupled to each other at an antenna node ANT. A shunt inductor L1 can be connected to the antenna node ANT. The transmit filter 141 and the receive filter 142 are both acoustic wave ladder filters in the duplexer 140.

The transmit filter 141 can filter a radio frequency signal and provide a filtered radio frequency signal to the antenna node ANT. A series inductor L2 can be coupled between a transmit input node TX and the acoustic wave resonators of the transmit filter 141. The illustrated transmit filter 141 includes acoustic wave resonators T01, T02, T03, T04, T05, T06, T07, T08, and T09. One or more of these resonators can be a bulk acoustic wave resonator with a floating raised frame structure in accordance with any suitable principles and advantages disclosed herein.

The illustrated receive filter 142 includes acoustic wave resonators R01, R02, R03, R04, R05, R06, R07, R08, and R09. One or more of these resonators can be a bulk acoustic wave resonator with a floating raised frame structure in accordance with any suitable principles and advantages disclosed herein. The receive filter can filter a radio frequency signal received at the antenna node ANT. A series inductor L3 can be coupled between the resonator and a receive output node RX. The receive output node RX of the receive filter provides a radio frequency receive signal.

In an embodiment, the receive filter 142 includes one or more bulk acoustic wave devices with a floating raised frame structure configured to increase Gamma of the receive filter 142 in a passband of the transmit filter 141. Alternatively or additionally, the transmit filter 141 includes one or more bulk acoustic wave devices with a floating raised frame structure configured to increase Gamma of the transmit filter 141 in a passband of the receive filter 142.

While the illustrated duplexer 140 includes a transmit filter and a receive filter, a duplexer can include two receive filters or two transmit filter in accordance with any suitable principles and advantages disclosed herein.

Although example embodiments may be discussed with filters or duplexers for illustrative purposes, any suitable principles and advantages disclosed herein can be implement in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include a bulk acoustic wave device with floating raised frame suture in accordance with any suitable principles and advantages disclosed herein.

A method of filtering a radio frequency signal according to an embodiment will now be described. The method includes receiving a radio frequency signal at port of an acoustic wave filter that includes a bulk acoustic wave resonator with a floating raised frame structure. The floating raised frame structure can include any suitable combination of features of the floating raised frame structures disclosed herein. The method also includes filtering the radio frequency signal with the acoustic wave filter in which the bulk acoustic wave resonator suppresses a raised frame mode.

Another method of filtering a radio frequency signal according to an embodiment will now be described. The method includes receiving a radio frequency signal at port of a first acoustic wave filter of a multiplexer. The first acoustic wave filter has a first passband. The multiplexer also includes a second acoustic wave filter coupled to the first acoustic wave filter at a common node. The second acoustic wave filter includes a bulk acoustic wave resonator with a floating raised frame structure. The method includes increasing Gamma of the second acoustic wave filter in the first passband with the bulk acoustic wave filter while the first acoustic wave filter filters the radio frequency signal. In some instances, the first acoustic wave filter and the second acoustic wave filter support carrier aggregation of at least a first carrier in the first passband and a second carrier in a second passband of the second acoustic wave filter.

Figure 15:
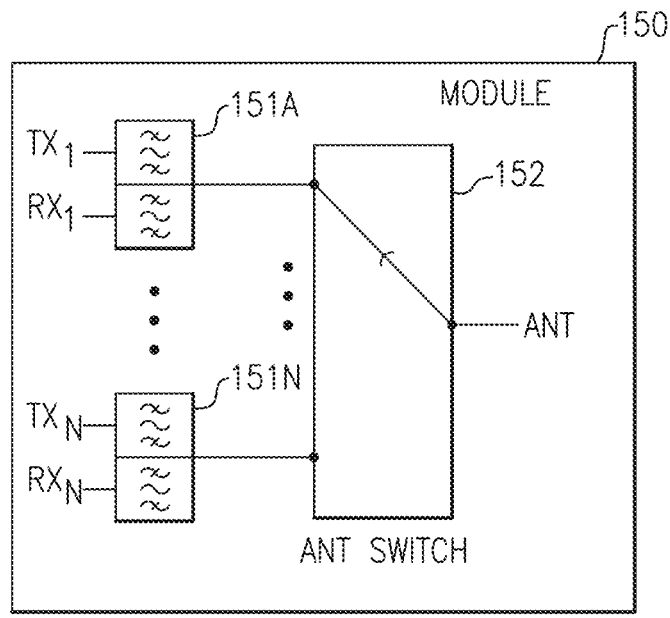
FIG. 15 is a schematic block diagram of a module that includes an antenna switch and duplexers that include one or more bulk acoustic wave devices according to an embodiment.
Figure 16:
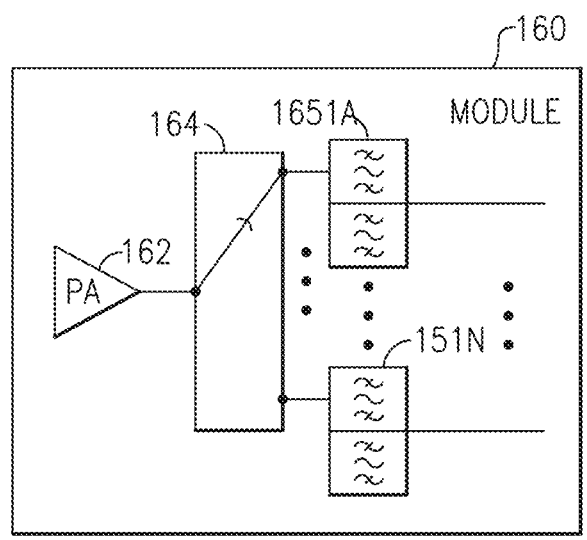
FIG. 16 is a schematic block diagram of a module that includes a power amplifier, a radio frequency switch, and duplexers that include one or more bulk acoustic wave devices according to an embodiment.
Figure 17:
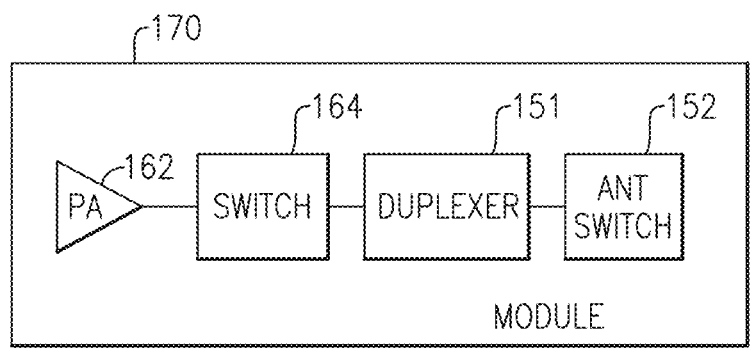
FIG. 17 is a schematic block diagram of a module that includes a power amplifier, a radio frequency switch, a duplexer that includes one or more bulk acoustic wave devices according to an embodiment.

The bulk acoustic wave resonators disclosed herein can be implemented in a variety of packaged modules. Some example packaged modules will now be discussed in which any suitable principles and advantages of the bulk acoustic wave devices disclosed herein can be implemented. The example packaged modules can include a package that encloses the illustrated circuit elements. The illustrated circuit elements can be disposed on a common packaging substrate. The packaging substrate can be a laminate substrate, for example. FIGS. 15, 16, and 17 are schematic block diagrams of illustrative packaged modules according to certain embodiments. Any suitable combination of features of these modules can be implemented with each other. While duplexers are illustrated in the example packaged modules of FIGS. 15 to 17, any other suitable multiplexer that includes a plurality of acoustic wave filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

FIG. 15 is a schematic block diagram of a module 150 that includes duplexers 151A to 151N and an antenna switch 152. One or more filters of the duplexers 151A to 151N can include any suitable number of bulk acoustic wave resonators in accordance with any suitable principles and advantages disclosed herein. Any suitable number of duplexers 151A to 151N can be implemented. The antenna switch 152 can have a number of throws corresponding to the number of duplexers 151A to 151N. The antenna switch 152 can electrically couple a selected duplexer to an antenna port of the module 150.

FIG. 16 is a schematic block diagram of a module 160 that includes a power amplifier 162, a radio frequency switch 164, and duplexers 151A to 151N in accordance with one or more embodiments. The power amplifier 162 can amplify a radio frequency signal. The radio frequency switch 164 can be a multi-throw radio frequency switch. The radio frequency switch 164 can electrically couple an output of the power amplifier 162 to a selected transmit filter of the duplexers 151A to 151N. One or more filters of the duplexers 151A to 151N can include any suitable number of bulk acoustic wave resonators in accordance with any suitable principles and advantages discussed herein. Any suitable number of duplexers 151A to 151N can be implemented.

FIG. 17 is a schematic block diagram of a module 170 that includes a power amplifier 162, a radio frequency switch 164, and a duplexer 151 that includes a bulk acoustic wave device in accordance with one or more embodiments, and an antenna switch 152. The module 170 can include elements of the module 150 and elements of the module 160.

Figure 18:
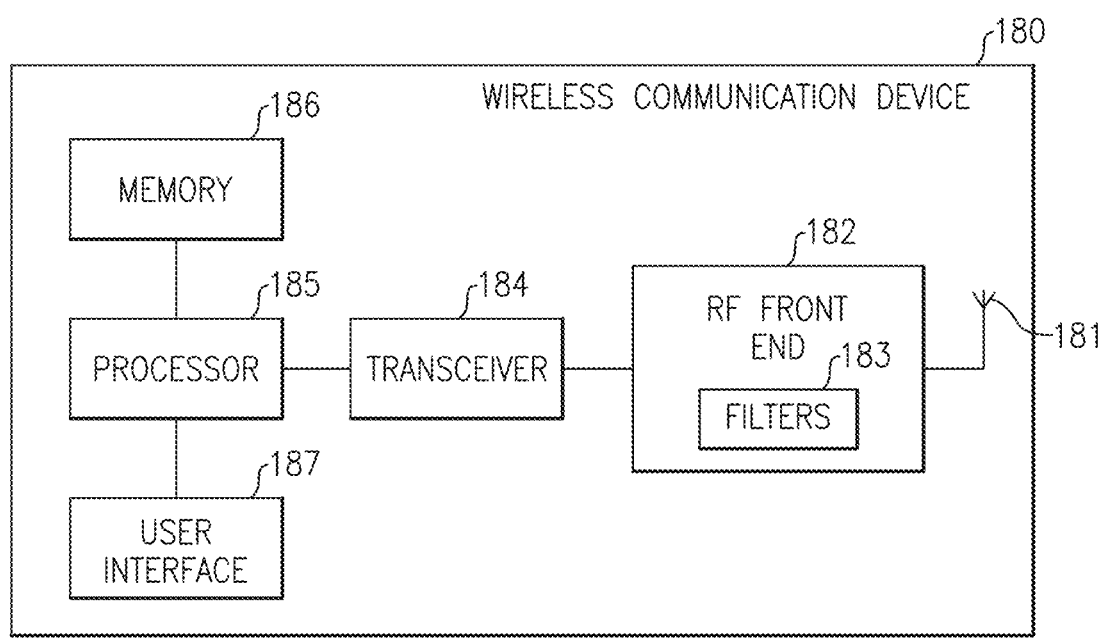
FIG. 18 is a schematic block diagram of a wireless communication device that includes filters that include one or more bulk acoustic wave devices according to an embodiment.

FIG. 18 is a schematic block diagram of a wireless communication device 180 that includes a filter 183 with one or more bulk acoustic wave resonators with a floating raised frame structure in accordance with any suitable principles and advantages disclosed herein. The wireless communication device 180 can be any suitable wireless communication device. For instance, a wireless communication device 180 can be a mobile phone, such as a smart phone. As illustrated, the wireless communication device 180 includes an antenna 181, a radio frequency (RF) front end 182 that includes filter 183, an RF transceiver 184, a processor 185, a memory 186, and a user interface 187. The antenna 181 can transmit RF signals provided by the RF front end 182. Such RF signals can include carrier aggregation signals. The antenna 181 can receive RF signals and provide the received RF signals to the RF front end 182 for processing. Such RF signals can include carrier aggregation signals. The wireless communication device 180 can include two or more antennas in certain instances.

The RF front end 182 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 182 can transmit and receive RF signals associated with any suitable communication standards. Any of the bulk acoustic wave resonators disclosed herein can be implemented in filters 183 of the RF front end 182. Any of the filter 183 can include one or more bulk acoustic wave resonators in accordance with any suitable principles and advantages disclosed herein.

The RF transceiver 184 can provide RF signals to the RF front end 182 for amplification and/or other processing. The RF transceiver 184 can also process an RF signal provided by a low noise amplifier of the RF front end 182. The RF transceiver 184 is in communication with the processor 185. The processor 185 can be a baseband processor. The processor 185 can provide any suitable base band processing functions for the wireless communication device 180. The memory 186 can be accessed by the processor 185. The memory 186 can store any suitable data for the wireless communication device 180. The processor 185 is also in communication with the user interface 187. The user interface 187 can be any suitable user interface, such as a display.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 410 MHz to 8.5 GHz.

Aspects of this disclosure can be implemented in various electronic devices. Examples of the electronic devices can include, but are not limited to, consumer electronic products, parts of the consumer electronic products such as packaged radio frequency modules and/or acoustic wave filter assemblies, uplink wireless communication devices, wireless communication infrastructure, electronic test equipment, etc.

Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, an robot such as an industrial robot, an Internet of things (IoT) device, a microwave, a refrigerator, a vehicular electronics system such as an automotive electronics system, a stereo system, a digital music player, a radio, a camera such as a digital camera, a portable memory chip, a networked appliance, washer, a dryer, a washer/dryer, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, devices, modules, apparatus, methods, and systems described herein may be embodied in a variety of other forms. Furthermore, various omissions, substitutions and changes in the form of the resonators, devices, modules, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A bulk acoustic wave device with raised frame mode suppression, the bulk acoustic wave device comprising:
    at least a first electrode and a second electrode;
    a piezoelectric layer positioned between the first electrode and the second electrode; and
    a floating raised frame structure between the first electrode and the piezoelectric layer, the floating raised frame structure being at a floating potential.

2. The bulk acoustic wave device of claim 1 wherein the floating raised frame structure is spaced apart from the first electrode by an electrically insulating material.

3. The bulk acoustic wave device of claim 1 wherein the floating raised frame structure is spaced apart from the first electrode by an air gap.

4. The bulk acoustic wave device of claim 1 wherein an overlap region of the bulk acoustic wave device includes thicker metal of the first electrode that than of a central part of an active region of the bulk acoustic wave device, and the first electrode extends away from the piezoelectric layer in the overlap region.

5. The bulk acoustic wave device of claim 4 wherein the floating raised frame structure is spaced apart from the first electrode by an air gap, and the air gap extends into at least part of the overlap region.

6. The bulk acoustic wave device of claim 4 wherein the floating raised frame structure is spaced apart from the first electrode by an electrically insulating material, and the electrically insulating material extends into at least part of the overlap region.

7. The bulk acoustic wave device of claim 1 wherein the floating raised frame structure is disposed along a perimeter of the bulk acoustic wave device.

8. The bulk acoustic wave device of claim 1 further comprising a support substrate and an acoustic reflector disposed between at least a portion of the support substrate and the piezoelectric layer.

9. The bulk acoustic wave device of claim 8 wherein the piezoelectric layer is positioned between the first electrode and the acoustic reflector.

10. The bulk acoustic wave device of claim 8 wherein the first electrode is positioned between the piezoelectric layer and the acoustic reflector.

11. The bulk acoustic wave device of claim 8 wherein the acoustic reflector is either an air cavity or an acoustic Bragg reflector.

12. A method of manufacturing a bulk acoustic wave device comprising:
    forming a first electrode over an air cavity;
    forming a piezoelectric layer over the first electrode;
    forming a floating raised frame structure over the piezoelectric layer; the floating raised frame structure being at a floating potential; and
    forming a second electrode over the floating raised frame structure.

13. The method of claim 12 further comprising spacing the floating raised frame structure apart from the second electrode with an electrically insulating material.

14. The method of claim 12 further comprising spacing the floating raised frame structure apart from the second electrode by an air gap.

15. The method of claim 12 further comprising depositing a thicker metal of the second electrode in an overlap region of the bulk acoustic wave device than a thickness of a central part of an active region of the bulk acoustic wave device, and the second electrode extends away from the piezoelectric layer in the overlap region.

16. The method of claim 15 further comprising spacing the floating raised frame structure apart from the second electrode by an air gap, and extending the air gap into at least part of the overlap region.

17. The method of claim 15 further comprising spacing the floating raised frame structure apart from the second electrode with an electrically insulating material, and extending the electrically insulating material into at least part of the overlap region.

18. The method of claim 12 further comprising disposing the floating raised frame structure along a perimeter of the bulk acoustic wave device.

19. The method of claim 12 further comprising forming a support substrate and an acoustic reflector between at least a portion of the support substrate and the piezoelectric layer.

20. The method of claim 19 wherein the piezoelectric layer is positioned between the first electrode and the acoustic reflector.

* * * * *